(12) United States Patent
Johnson

(10) Patent No.: US 7,532,687 B2
(45) Date of Patent: May 12, 2009

(54) DUAL STAGE AUTOMATIC GAIN CONTROL IN AN ULTRA WIDEBAND RECEIVER

(75) Inventor: Terence L. Johnson, Fairfax, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 682 days.

(21) Appl. No.: 11/036,132

(22) Filed: Jan. 18, 2005

(65) Prior Publication Data

US 2006/0159058 A1   Jul. 20, 2006

(51) Int. Cl.
*H04L 27/08* (2006.01)
(52) U.S. Cl. .................. 375/345; 375/130; 348/528; 379/388.03; 379/395
(58) Field of Classification Search .......... 367/65; 360/43; 455/313; 370/203; 375/345
See application file for complete search history.

(56) References Cited

U.S. PATENT DOCUMENTS

| 3,398,395 | A | * | 8/1968 | Ward ........................... 367/65 |
| 3,514,759 | A | * | 5/1970 | Hasenbalg et al. ............ 360/43 |
| 5,548,839 | A | * | 8/1996 | Caldwell et al. ............ 455/313 |
| 6,289,000 | B1 | * | 9/2001 | Yonge, III ................... 370/203 |
| 2003/0067963 | A1 | * | 4/2003 | Miller et al. ................ 375/130 |

* cited by examiner

*Primary Examiner*—David C Payne
*Assistant Examiner*—Adolf Dsouza

(57) ABSTRACT

A method (500) and an apparatus (300) are presented for processing a signal in a receiver in accordance with Ultra Wideband (UWB) protocol. The received signal is acquired during a first preamble portion (411) of a data frame associated with the UWB protocol. During acquisition a first Automatic Gain Control (AGC) operation (606) is performed associated with a noise component of the signal. A second AGC operation (608) associated with a pulse component of the signal is performed after the acquiring the signal during a second preamble portion (413).

25 Claims, 4 Drawing Sheets

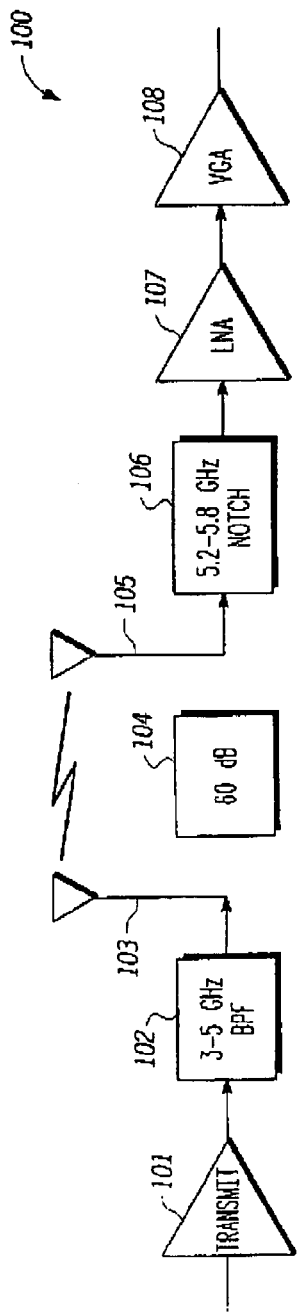
FIG. 1 —RELATED ART—
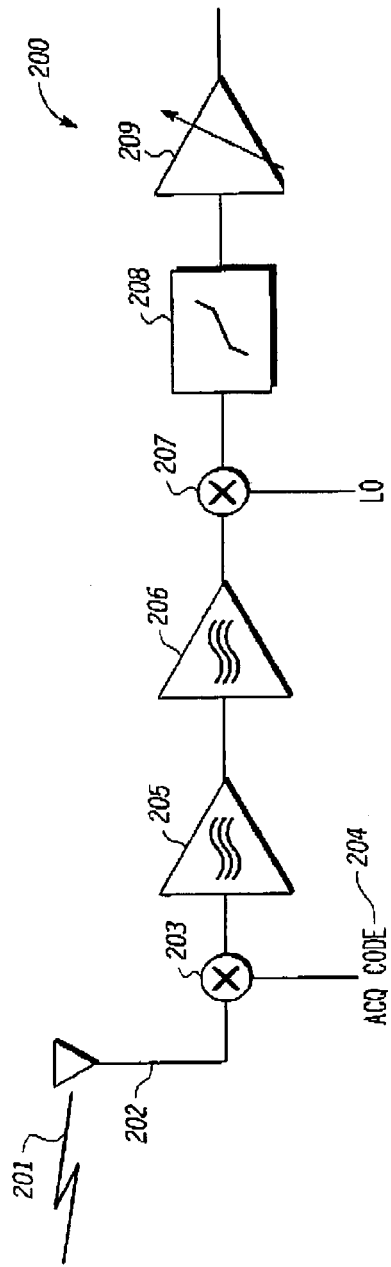
FIG. 2 —RELATED ART—

DUAL STAGE AUTOMATIC GAIN CONTROL IN AN ULTRA WIDEBAND RECEIVER

CROSS-REFERENCE TO RELATED APPLICATIONS

The present invention is related to International Application PCT/US2004/003362, entitled "SYSTEM AND METHOD FOR PASSING DATA FRAMES IN A WIRELESS NETWORK", filed Feb. 27, 2004.

FIELD OF THE INVENTION

The present invention relates in general to Ultra Wideband (UWB) systems, including UWB receivers, and related equipment. More specifically, the present invention relates to a dual stage Automatic Gain Control (AGC) circuit for use in UWB systems.

BACKGROUND OF THE INVENTION

As UWB communication becomes increasingly desirable for communication between wireless devices due to its low power, speed, and capacity combined with its resilience to interference within high-frequency bands, design of certain modules associated with the initial Radio Frequency (RF) processing, also referred to as the RF "front end", becomes a great challenge due to the unique characteristics of the UWB signal environment. In particular, the Automatic Gain Control (AGC) circuit is a common and important RF module whose design poses unique challenges in the UWB environment.

It is understood that several challenges exist in successful AGC module design for UWB systems. Since gain adjustment is generally required to set input levels to conversion stages, such as Analog to Digital conversion stages, the speed of AGC circuits is of critical importance. While certain parameters may be relaxed in connection with UWB AGC requirements, such as, for example, linearity, the speed at which gain of an incoming UWB signal can be adjusted is of critical importance due in large measure to the high frequencies associated with UWB transmission and the commensurate speed required for performing signal processing.

In a related processing procedure, the signal acquisition procedure allows the detection of the beginning of a UWB transmission sequence associated, for example, with a frame transmission, and can provide, for example, a UWB receiver sufficient time to make several measurements in order to attempt to find a multipath component with the most desirable, or stronger, signal. In order to detect the beginning of the UWB transmission sequence or frame, it is important that the preamble common to UWB transmissions and specified in UWB standards, such as standards and definitions put forth by the Institute of Electrical and Electronic Engineers (IEEE), 802.15.3(a) working group, is able to be detected.

In addition to facilitating proper synchronization of the UWB receiver with the received signal phase and the like, the preamble further provides the ability for the receiver to achieve fundamental signal acquisition or signal lock whereby the receiver "locks" onto the signal containing the incoming frame. It will be appreciated that a typical preamble includes a known, recognizable, and repeated pattern of bits that a receiver can easily recognize and therefore detect. It will be appreciated that while, as described, a preamble generally contains a known pattern, the actual starting point within the pattern at which the receiver recognizes or detects the preamble will be random or asynchronous with respect to the actual start of the preamble pattern as transmitted. Thus, once the receiver successfully locks or synchronizes with an incoming preamble, there is generally no way to determine with a high degree of confidence when the end of the preamble will be received and thus how much time remains for the receiver to perform additional functions.

In a narrow band system, a receiver can relatively accurately detect a start time at which carrier energy is detected in the RF environment, allowing a narrowband receiver to determine a preamble start time with a high degree of precision, and the receiver is capable of knowing how much time remains before the end of the preamble is received and more significant information must be received and processed. In a UWB system, however, because the signals have an extremely low signal-to-noise (SNR) ratio, energy detection is difficult and generally undesirable as a solution to accurately detecting the beginning of the preamble.

In UWB receivers requiring additional signal processing or other preparation before receiving information from a frame, problems may arise due to limited detection ability. For example, some operations may be performed to improve signal quality which may require additional training time to operate. As noted, since the UWB receiver does not know how much time remains in the preamble after signal lock, it cannot determine whether there is sufficient time remaining for additional operations.

Accordingly, it would be desirable in the art for a solution to the problems associated with unknown relative signal lock timing, and further to the problems associated with trying to allow adequate time for receiver training when a receiving device has no way of knowing the remaining time in a preamble once signal lock is completed.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

FIG. 1 is a block diagram illustrating blocks associated with an exemplary Ultra Wide Band (UWB) transmitter and receiver in a typical UWB environment;

FIG. 2 is a block diagram illustrating exemplary components in an exemplary receiver in accordance with various exemplary embodiments;

DETAILED DESCRIPTION OF PREFERRED EMBODIMENTS

Figure 3:
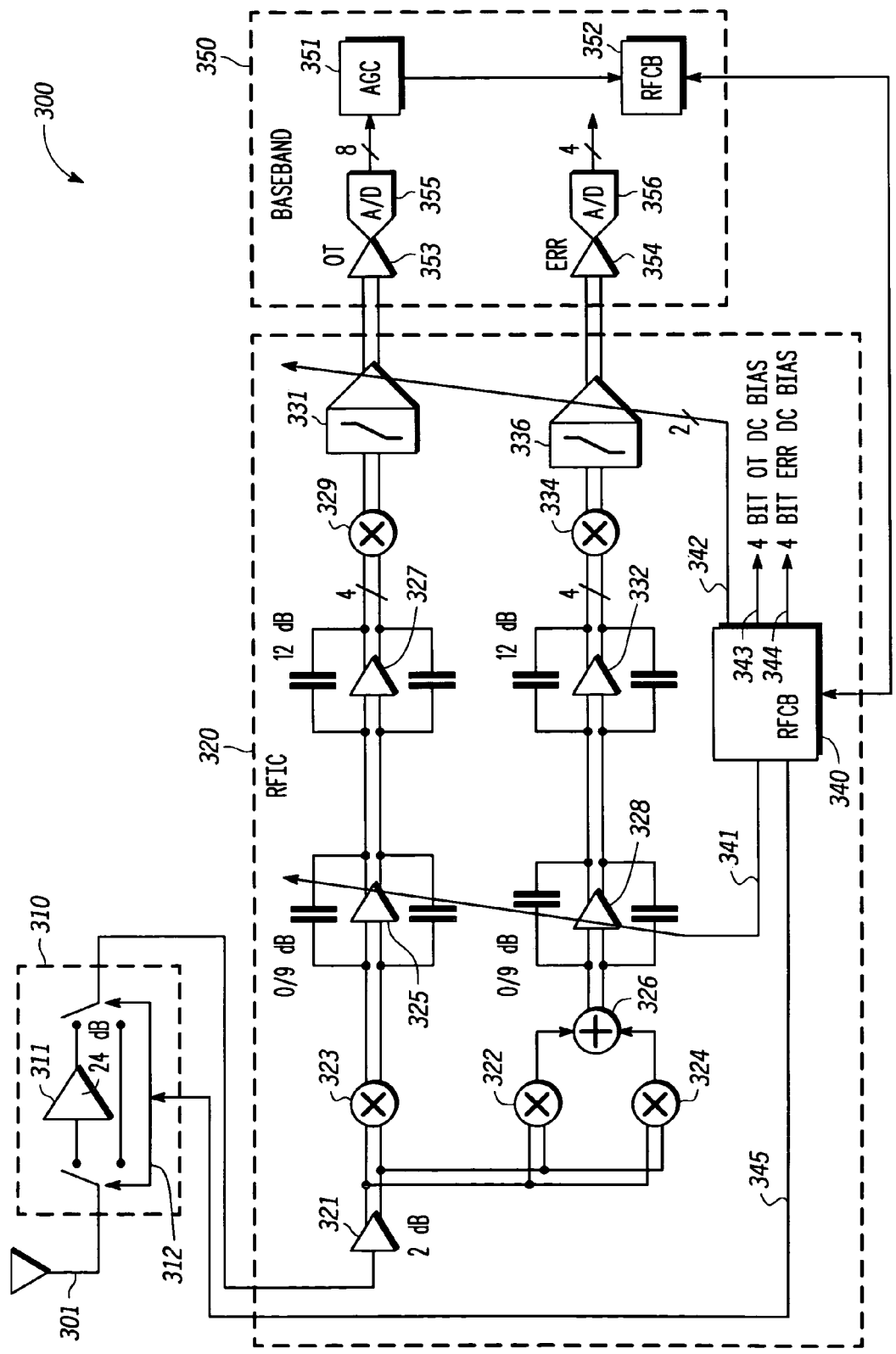
FIG. 3 is a schematic diagram illustrating exemplary components of a dual stage Automatic Gain Control (AGC) apparatus in accordance with various exemplary embodiments.
Figure 4:
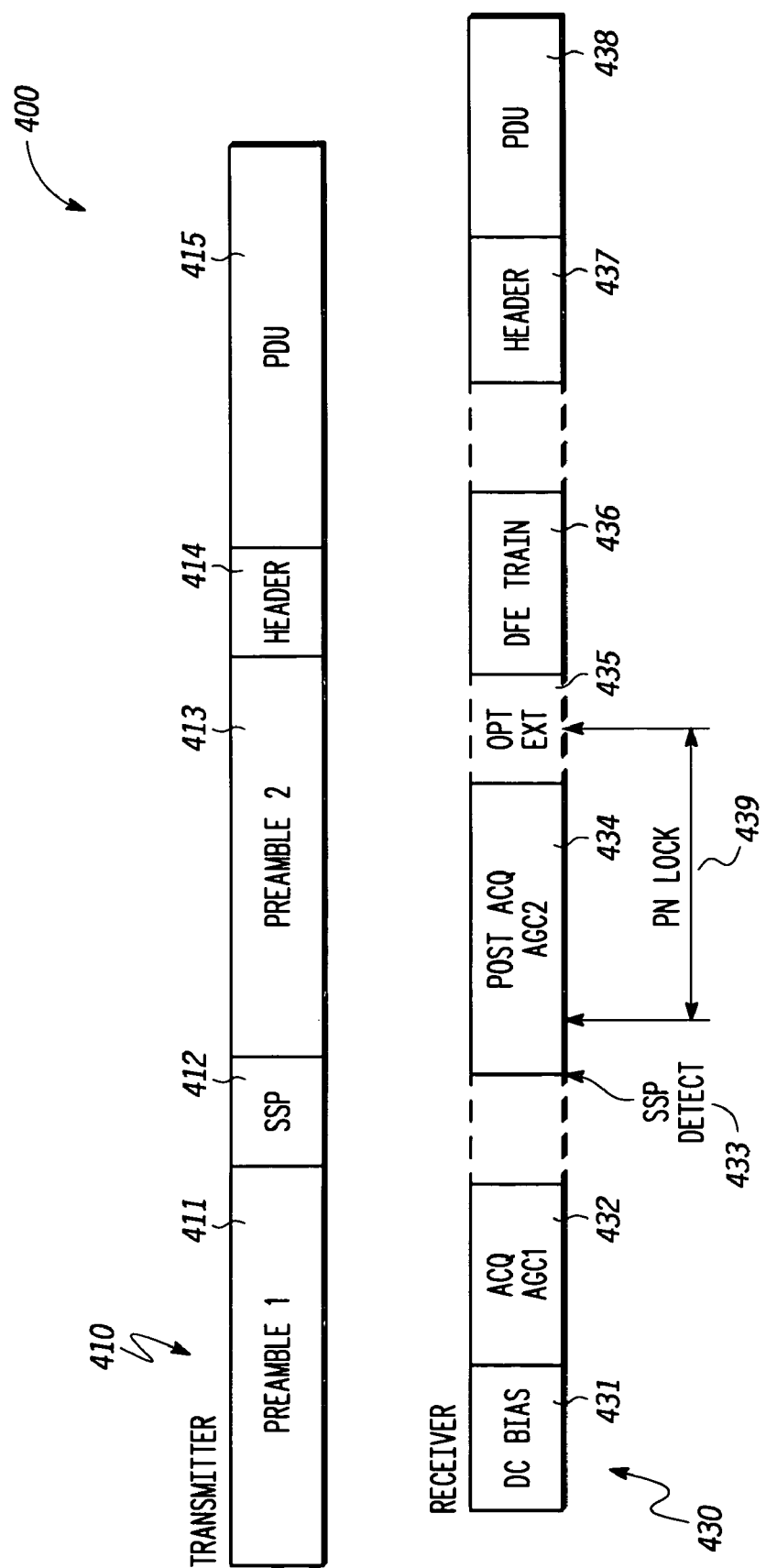
FIG. 4 is a diagram illustrating exemplary components of a data frame associated with a UWB protocol for a transmitter and a receiver in accordance with various exemplary embodiments of the present invention.

In overview, the present invention relates to a dual stage Automatic Gain Control (AGC) in an UWB wireless communication system. More particularly, various inventive concepts and principles are embodied in a UWB receiver, and methods therein for performing dual stage AGC. It should be noted that in addition to connoting a receiver for use in wideband communications in accordance with Orthogonal Frequency Division Multiplexing (OFDM), the term UWB receiver may be used interchangeably with receiver, transceiver or the like. Each of these terms denotes a device ordinarily associated with a UWB system or network.

The present description is provided to further explain, in an enabling fashion, exemplary modes of performing one or more embodiments of the present invention. The description is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is understood that the use of relational terms such as first and second, and the like, if any, are used solely to distinguish one from another entity, item, or action without necessarily requiring or implying any actual such relationship or order between such entities, items or actions.

Much of the inventive functionality and many of the inventive principles when implemented, are best supported with or in software or integrated circuits (ICs), such as a digital signal processor and software therefore or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the preferred embodiments.

With reference to FIG. 1, where an exemplary transmitter and receiver are shown in a UWB environment 100, information signals can be input to a transmit amplifier 101 as will be appreciated by those of ordinary skill in the art. It should be noted that for the sake of simplicity, various steps associated with preparing an information stream will be omitted from the discussion in order to avoid confusion. However, as will be appreciated, a variety of channel and other baseband coding procedures such as convolutional encoding and the like may be performed in addition to intermediate procedures associated with conforming to UWB protocols and the like. The information signals can be output from the transmit amplifier 101 and input to a bandpass filter stage 102 with a passband set at between 3 GHz and 5 GHz. The amplified information signals can be transmitted using antenna 103 over an air interface such that an end-to-end path gain level of, for example, as high as 60 dB can be achieved. The signals are received using antenna 105 and may undergo certain front end processing to extract the information signals therefrom. The signals can be passed through another filter stage with a notch at between 5.2 to 5.8 GHZ to extract all but the desired signal components which, as will be appreciated by one of ordinary skill will contain noise energy and signal energy typically including a noise component and a signal component.

To better appreciate the operation of the dual stage AGC circuit in accordance with various exemplary embodiments, reference is made herein to FIG. 2, wherein exemplary receiver environment 200 is shown. A received signal 201 may be processed in accordance with a UWB protocol such that standards such as the Institute of Electrical and Electronic Engineering (IEEE) standard 802.15.3(a) are complied with. The received signal 201 is received using an antenna 202 and may be input to a multiplier 203. An acquisition code ACQ CODE 204 may be applied to multiplier consisting of a predetermined wavelet function such as a bipolar doublet of a particular configuration which may be used, for example, by shifting in phase while applying to the multiplier 203 to discriminate the signal from the noise level. The composite signal may be output from the multiplier 203 and input to filter stage 205 and filter stage 206.

The output of the filter stage 205 and filter stage 206 can be input to another mixer 207 where a local oscillator (LO) signal can be applied as will be understood and appreciated by those of ordinary skill. The output of multiplier 207 is input to integrator 208 and input to Variable Gain Amplifier 209 where a gain level can be applied such that the excursions of the signal can be set to optimize the range of, for example, an Analog to Digital conversion stage.

In order to better appreciate the inventive principles discussed and described herein a more detailed illustration of dual stage AGC unit 300 is shown in FIG. 3. Dual stage AGC unit 300 can include a RF-switched 24 dB gain stage 310 for receiving a signal input from an antenna 301, a variable gain stage 320, and a baseband stage 350. The variable gain stage 320 further includes a dual stage AGC controller 340 which can be used to implement dual stage AGC in accordance with various exemplary embodiments. It will be appreciated that some or even all of the components of the dual stage AGC unit 300 such as, for example, variable gain stage 320, can be implemented as an RF Integrated Circuit (RFIC). The RF-switched 24 dB gain stage 310 further includes a switchable 24 dB gain element 311 and a pass through element 312. The signal path can be switched using an RF control signal 345 from the dual stage AGC controller 340. The output of the RF-switched 24 dB gain stage 310 can be input to an initial 2 dB gain stage 321 of dual stage AGC unit 320. The output of the initial 2 dB gain stage 321 can be input in parallel to a multiplier element 322, a multiplier element 323, and a multiplier element 324 where, as noted above, a ACQ CODE signal, which to simplify the drawing is not shown, is input to the multiplier element 322, the multiplier element 323, and the multiplier element 324.

The output of the multiplier 323 can be input to a 0 dB and 9 dB selectable gain element 325 and a 12 dB fixed gain element 327. The output of the 12 dB fixed gain element 327 can be input to a multiplier element 329 where a LO signal can be applied to complete, for example, the removal of DC bias components and the like. The output of the multiplier element 329 can be input to a variable integrator element 331 where a post integration gain may be applied as a 2 bit control value 342 by the AGC control logic from, for example, the dual stage AGC controller 340. The output of the variable integrator element 331 can be input to baseband stage 350 to a baseband amplifier 353 and input to an Analog to Digital converter 355 with an 8 bit output coupled to and AGC feedback control element 351 which can be used to monitor AGC levels in a dual stage AGC controller 352 which can be separately implemented in baseband stage 350 and is bi-directionally coupled to the dual stage AGC controller 340.

On a parallel signal path, the output of the multiplier element 322 and the multiplier element 324 can be used as an error signal and can be input to a mixer element 326 for automatic gain control in a 0dB and 9 dB selectable gain element 328 and a 12 dB fixed gain element 332. The output of the 12 dB fixed gain element 332 can be input to a multiplier element 334 where a LO signal can be applied to complete, for example, the removal of DC bias components and the like. The output of the multiplier element 334 can be input to a variable integrator element 336 where a post integration gain may be applied as a 2 bit control value 342 by the AGC control logic from, for example, the dual stage AGC controller 340. The output of the variable integrator element 336 can be coupled to a baseband amplifier 354 and input to an Analog to Digital converter 356 with an 4 bit error output. The dual stage AGC controller 340 can further output a value such as an 8-bit value 343 for On-time (Ot) DC bias control and a 4 bit value 344 for the Error (Err) signal path. The 8-bit value 343 and the 4 bit value 344 correspond to the DC bias levels such that the LO control and ACQ CODE control can be adjusted to compensate and cancel DC bias levels.

To perform dual stage AGC in accordance with various exemplary embodiments, reference can be made to exemplary data frames 400 associated with a transmitter frame 410 and a receiver frame 430. It will be appreciated that the transmitter frame 410 represents the frame format for information transmitted in a UWB signal over an exemplary air interface or the like. It will be appreciated that the transmitter frame 410 and the receiver frame 430 are related in that the receiver frame 430 reflects what the receiver receives, reads, interprets, acts upon or the like with regard to the transmitter frame 410. Thus the transmitter frame 410 includes a first preamble 411 having as noted above a repeated recognized pattern of bits as will be appreciated by one of ordinary skill in the art. A Start of Second Preamble (SSP) marker 412, which can be a recognizable pattern different from the pattern associated with the first preamble 411, will be between the first preamble 411 and the second preamble 413. After the second preamble 413, a header 414 which can contain address information, such as a device address, packet size information, and the like as will be appreciated by one of ordinary skill in the art, is positioned just before Protocol Data Unit (PDU) 415.

When an exemplary receiver begins to process a received signal containing the information associated with the transmitter frame 410, the exemplary receiver begins to build the receiver frame 430 when certain portions thereof are detected and recovered portion by portion. For example, when the exemplary receiver detects that the received signal information contains a DC bias level portion 431 associated with for example, the first preamble, an acquisition procedure can begin during an ACQ AGC 1 portion 432 and a corresponding first AGC procedure can start in accordance with various exemplary embodiments to set, for example, a noise component level associated with the received signal to a level which, for example, approximates a Root Mean Square (RMS) value. It will be appreciated that due to concerns such as complexity, accuracy, processing speed and the like, the actual RMS of the signal level is not calculated but rather a level proportional to a reference level or the like is used, such as a 0.707 reference factor or the like. Alternatively, the noise component level can be set to a predetermined value which provides the best result for a signal to noise ratio or other performance metric. The exemplary receiver can continue to perform the first AGC procedure during the ACQ AGC 1 portion 432 until a Start of Second Preamble (SSP) portion 433 is detected. Detection of the SSP portion 433 can be used to signal the exemplary receiver that a second AGC procedure can begin in accordance with various exemplary embodiments during a post-acquisition stage such as a PostACQ AGC 2 portion 434. It should be noted that to generate a signal "lock" separate circuitry, not shown for simplicity, is configured to search for the PN signal at which time the "lock" signal is generated so that the DFE may train when the AGC is done as will be described in greater detail hereinafter. It will be appreciated that the term lock may refer to a definitive timing synchronization between the exemplary receiver and the incoming data frame.

By locking, the receiver can be assured that the PDU payload associated with the received data frame will be accurately recovered. It will further be appreciated that during the PostACQ AGC 2 portion 434 the exemplary receiver can apply a second AGC procedure to a pulse component of the received signal. The second AGC procedure can be used to set a signal level associated with the pulse component in a manner aimed at ensuring that the full range of the Analog to Digital conversion stage will be used when an average value associated with the maximum excursion of the pulse component is received. Thus, an average value of the maximum excursion of the pulse component must be determined, for example, from a series of samples of the pulse component which fall above a certain analog level. When the average value of the maximum excursion of the pulse component is reached, the gain level of the pulse component can be adjusted or set during the second AGC procedure such that the Analog to Digital conversion generates a maximum digital output when the average value of the maximum excursion of the pulse component is input thereto.

It will be appreciated that the second AGC procedure can be extended during an optional extension period 435 where additional gain control can be applied if necessary. A decision feedback equalization (DFE) training portion 436 can be conducted to further refine the signal recovery parameters and eventually, a header portion 437 and corresponding Protocol Data Unit (PDU) 438 containing the information payload associated with the signal transmission will be recovered and processed in accordance with the governing protocol, such as a protocol in accordance with the IEEE 802.15.3(a) standard.

Figure 5:
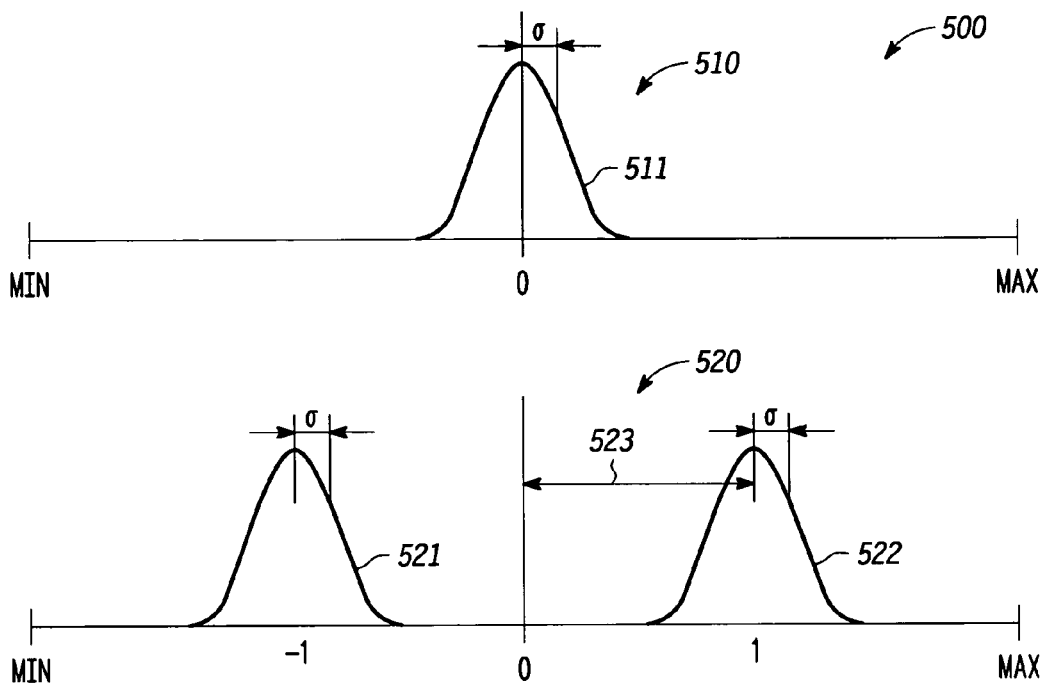
FIG. 5 is a graph illustrating representative signal spectra associated with pre-Acq AGC and post-Acq AGC signal intervals in accordance with various exemplary embodiments of the present invention.

To better understand the dual stage AGC in accordance with various exemplary embodiments, a signal level graphical environment 500 is shown in FIG. 5. A graph 510 shows the energy distribution 511 of a noise component of the received signal during the first AGC interval, such as during the reception of the ACQ AGC 1 portion 432 of receiver frame 430. It will be appreciated that a gain level, strength level, power level, or the like of the noise component, error component or the like, can be set during the first AGC interval which may alternatively be referred to as the pre-acquisition period, such as the period shortly after an indication such as Rx_Active or the like is received indicating that a received signal is believed to be incoming. It will further be appreciated that the level adjustment made during the first AGC interval can be made in accordance with or proportional to a σ of the power distribution as shown in the energy distribution graph 511.

A graph 520 shows the respective energy distributions 521 and 523 of the "−1" and "1" pulse components of the received signal during the second AGC interval, such as after lock and during the reception of the PostACQ AGC 2 portion 434. It will be appreciated that the pulse center distance 523, that is, the distance between the 0 power level reference and the pulse center, shown in FIG. 5 with reference to the "1" pulse, can be set by adjusting a ACQ CODE oscillator signal, which is signal of a known sequence multiplied with the incoming signal to achieve a maximum pulse power level. It will further be appreciated that a "−1" pulse component value will correspond to a digital zero and a "+1" pulse component value will correspond to a digital 1 value. The pulse component level adjustment made during the second AGC interval can be made in accordance with or proportional to a σ or mean of the power distribution as shown in the energy distribution graphs 521 and 522. It will further be noted that signal power level desired for the pulse components is programmable and it typically set such that maximum excursions, or the level proportional to the maximum excursions for the pulse components and corresponds to values of + and −64 for the Analog to Digital conversion stages which are typically capable of generating minimum and maximum values of −128 to +127.

Figure 6:
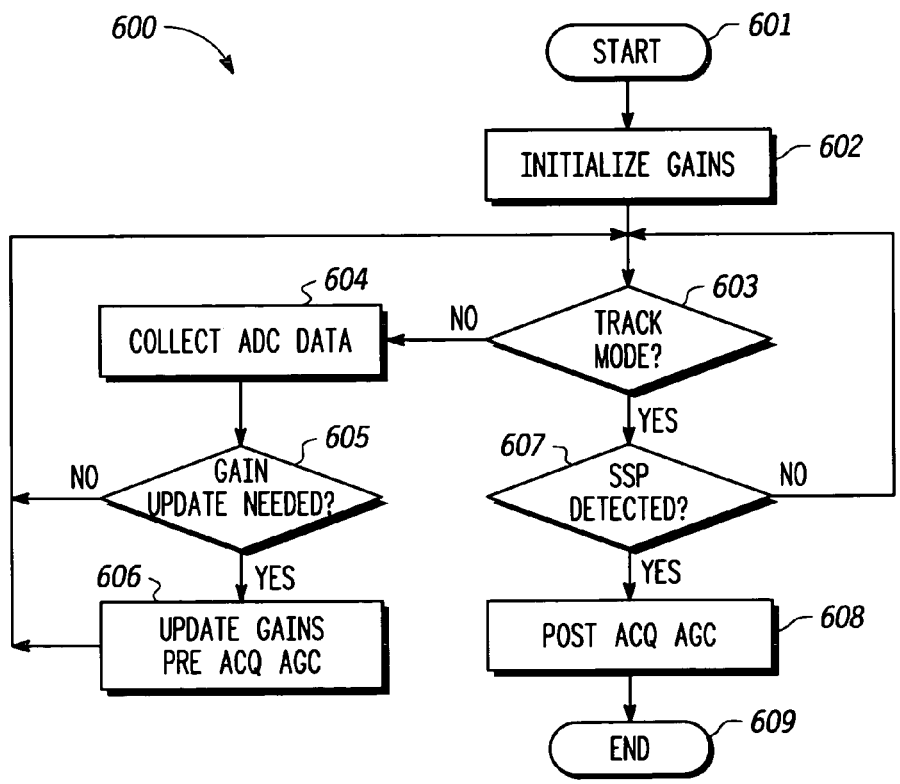
FIG. 6 is a flow chart illustrating exemplary procedures in accordance with various exemplary embodiments of the present invention.

A simplified and representative flow chart 600 associated with operation of the dual stage AGC in accordance with various exemplary embodiments is illustrated in FIG. 6. After start at 601, initial conditions such as initial gain values and the like for the exemplary receiver and dual stage AGC unit can be set at 602. It will be appreciated by one of ordinary skill in the art that a track mode is typically entered once a reliable synchronization with the received signal is achieved, thus a test can be performed at 603 to determine if the exemplary receiver is presently in the track mode. If synchronization has not been achieved and the track mode has not been entered, then data can be collected from the exemplary Analog to Digital Converter (ADC) at 604 where gain levels and the like can be compared against reference values, such as the mean power levels described above in connection with FIG. 5, for the pre-acquisition AGC. If gain updates are needed as determined, for example, at 605, then gain values can be updated during the first AGC interval at 606. If no gain 5 updates are needed, the exemplary procedure can cycle through the track mode test at 603, the data collection at 604, and the gain update test at 605 until gain updates are needed or until the track mode is entered as determined at 603. From the track mode test at 603, it can be determined whether a marker such as the SSP 433 is detected at 607 signaling the end of the first preamble and the start of the second preamble and 10 thus the start of the second AGC interval. If the SSP is not detected at 607, the exemplary procedure can loop between testing for track mode at 603 and detecting the SSP at 607. If the SSP is detected at 607, then a second AGC operation can be performed at 608 for example during reception of the PostACQ AGC 2 portion 434 as described herein above. Once the second AGC operation is performed at 608, the exemplary procedure can end at 609. It will be appreciated that while the exemplary procedure is indicated as ending at 609, it will be reinvoked for every one of the received frame 430.

Although this disclosure discusses a UWB device using the IEEE 802.15.3(a) standard by way of example, the general design is also applicable to other wireless networks, and should not be considered to be limited to application with respect to IEEE 802.15.3(a) networks. It should further be noted that while the present invention is applicable to trellis decoding in a UWB device which operates at different speeds and in different modes, the present invention should not be limited to any particular type of decoding operation, but can be used in any decoding situation where a convolutionally encoded symbol is present and for which its features would be advantageous.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for processing a signal in a receiver in accordance with Ultra Wideband (UWB) protocol, the method comprising:
    splitting the signal into a pulse component and a noise component;
    acquiring the signal during a first preamble portion of a data frame associated with the UWB protocol and, during the acquiring, performing a first Automatic Gain Control (AGC) operation associated with a noise component of the signal using AGC circuitry; and
    performing a second AGC operation associated with a pulse component of the signal after acquiring the signal during a second preamble portion of the data frame associated with the UWB protocol using the AGC circuitry, the first preamble portion being different from the second preamble portions,
    wherein the performing the first AGC operation associated with the noise component of the signal includes adjusting the noise component of the signal to an approximate value proportional to a received power level associated with the signal and an approximate Root Mean Square (RMS) value.

2. A method, as recited in claim 1, further comprising detecting a portion of the data frame after the first preamble portion and before the second preamble portion, and wherein the acquiring the signal is deemed to have occurred when the portion is detected.

3. A method, as recited in claim 1, wherein the UWB protocol includes a protocol in accordance with the Institute of Electrical and Electronic Engineering (IEEE) 802.15.3(a) standard.

4. A method, as recited in claim 1, further comprising:
    processing the signal according to a first rate and a second processing rate; and
    detecting a portion of the data frame after the first preamble portion and before the second preamble portion when the acquiring the signal is deemed to have occurred, wherein:
        the first preamble portion of the data frame associated with the UWB protocol is processed in accordance with the first rate; and
        the remainder of the data frame is processed according to the second rate after the portion is detected after the first preamble portion.

5. A method, as recited in claim 1, wherein the portion detected after the first preamble portion and before the second preamble portion includes a Start of Second Preamble (SSP) portion.

6. A method, as recited in claim 1, wherein the performing the second AGC operation associated with the pulse component of the signal includes adjusting the pulse component of the signal to an average of the absolute received power level associated with the pulse component of the signal.

7. A method, as recited in claim 1, wherein at least one of the first AGC operation and the second AGC operation includes adjusting one of the noise component and the pulse component associated with the at least one of the first AGC operation and the second AGC operation in accordance with one or more of: a programmable gain stage and a fixed gain stage.

8. A method, as recited in claim 1, wherein at least one of the first AGC operation and the second AGC operation includes adjusting one of the noise component and the pulse component associated with the at least one of the first AGC operation and the second AGC operation in accordance with one or more of: a programmable gain stage including programming one of a 0 dB gain level and a 9 dB gain level; and a fixed gain stage including a 12 dB gain level.

9. A method, as recited in claim 1, further comprising processing the received signal in an integrate and hold circuit including programmable gain levels including 0 dB, 3 dB, and 6 dB increments.

10. A method for processing a received signal in an Ultra Wideband (UWB) receiver, the method comprising:
acquiring the received signal during a first preamble portion of a data frame associated with the received signal and, during the acquiring, performing a first Automatic Gain Control (AGC) operation using AGC circuitry; and
performing a second AGC operation after the acquiring the received signal during a second preamble portion of the data frame associated with the received signal using the AGC circuitry, the first preamble portion different from the second preamble portion,
wherein the acquiring the received signal is deemed to have occurred when a portion is detected after the first preamble portion and before the second preamble portion,
wherein the first AGC operation includes adjusting a noise level associated with the received signal to an approximate value proportional to a received power level associated with the signal and an approximate Root Mean Square (RMS) value, and
wherein the second AGC operation includes adjusting a pulse level associated with the received signal to an average of the absolute received power level associated with the pulse component of the signal.

11. A method, as recited in claim 10, further comprising processing the received signal according to a first rate and a second processing rate, and wherein:
the first preamble portion of the data frame associated with the received signal is processed in accordance with the first rate; and
after the portion is detected after the first preamble portion, the remainder of the data frame is processed according to the second rate.

12. A method, as recited in claim 10, wherein the portion detected after the first preamble portion and before the second preamble portion includes a Start of Second Preamble (SSP) portion.

13. A method, as recited in claim 10, wherein the adjusting the pulse level associated with the received signal includes adjusting the pulse component of the signal to an average of the absolute received power level associated with the pulse component of the signal.

14. A method, as recited in claim 10, wherein the adjusting the noise level associated with the received signal includes adjusting the noise level to an approximate Root Mean Square (RMS) value.

15. A method, as recited in claim 10, wherein at least one of the first AGC operation and the second AGC operation includes adjusting the received signal in accordance with one or more of: a programmable gain stage and a fixed gain stage.

16. A method, as recited in claim 10, wherein at least one of the first AGC operation and the second AGC operation includes adjusting the received signal in accordance with one or more of: a programmable gain stage including programming one of a 0 dB gain level and a 9 dB gain level; and a fixed gain stage including a 12 dB gain level.

17. A method, as recited in claim 10, further comprising processing the received signal in an integrate and hold circuit including programmable gain levels including 0 dB, 3 dB, and 6 dB increments.

18. A method for processing a signal in a receiver in accordance with Ultra Wideband (UWB) protocol, the method comprising:
splitting the signal into a pulse component and a noise component;
acquiring the signal during a first preamble portion of a data frame associated with the UWB protocol and, during the acquiring, performing a first Automatic Gain Control (AGC) operation associated with a noise component of the signal using AGC circuitry; and
performing a second AGC operation associated with a pulse component of the signal after acquiring the signal during a second preamble portion of the data frame associated with the UWB protocol using the AGC circuitry, the first preamble portion being different from the second preamble portion,
wherein the performing the second AGC operation associated with the pulse component of the signal includes adjusting the pulse component of the signal to an average of the absolute received power level associated with the pulse component of the signal.

19. A method, as recited in claim 18, further comprising detecting a portion of the data frame after the first preamble portion and before the second preamble portion, and
wherein the acquiring the signal is deemed to have occurred when the portion is detected.

20. A method, as recited in claim 18, wherein the UWB protocol includes a protocol in accordance with the Institute of Electrical and Electronic Engineering (IEEE) 802.15.3(a) standard.

21. A method, as recited in claim 18, further comprising:
processing the signal according to a first rate and a second processing rate; and
detecting a portion of the data frame after the first preamble portion and before the second preamble portion when the acquiring the signal is deemed to have occurred, wherein:
the first preamble portion of the data frame associated with the UWB protocol is processed in accordance with the first rate; and
the remainder of the data frame is processed according to the second rate after the portion is detected after the first preamble portion.

22. A method, as recited in claim 18, wherein the portion detected after the first preamble portion and before the second preamble portion includes a Start of Second Preamble (SSP) portion.

23. A method, as recited in claim 18, wherein at least one of the first AGC operation and the second AGC operation includes adjusting one of the noise component and the pulse component associated with the at least one of the first AGC operation and the second AGC operation in accordance with one or more of: a programmable gain stage and a fixed gain stage.

24. A method, as recited in claim 18, wherein at least one of the first AGC operation and the second AGC operation includes adjusting one of the noise component and the pulse component associated with the at least one of the first AGC operation and the second AGC operation in accordance with one or more of: a programmable gain stage including programming one of a 0 dB gain level and a 9 dB gain level; and a fixed gain stage including a 12 dB gain level.

25. A method, as recited in claim 18, further comprising processing the received signal in an integrate and hold circuit including programmable gain levels including 0 dB, 3 dB, and 6 dB increments.

* * * * *